(12) United States Patent
Wang et al.

(10) Patent No.: US 10,515,870 B1
(45) Date of Patent: Dec. 24, 2019

(54) PACKAGE CARRIER HAVING A MESH GAS-PERMEABLE STRUCTURE DISPOSED IN THE THROUGH HOLE

(71) Applicant: Unimicron Technology Corp., Taoyuan (TW)

(72) Inventors: Chin-Sheng Wang, Taoyuan (TW); Pei-Chang Huang, Taoyuan (TW); Ra-Min Tain, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/029,659

(22) Filed: Jul. 9, 2018

(30) Foreign Application Priority Data

May 30, 2018 (TW) .............................. 107118580 A

(51) Int. Cl.
*H01L 23/367* (2006.01)
*H01L 23/467* (2006.01)
*H01L 23/498* (2006.01)

(52) U.S. Cl.
CPC ........ *H01L 23/467* (2013.01); *H01L 23/3672* (2013.01); *H01L 23/49822* (2013.01); *H01L 23/49838* (2013.01); *H01L 23/49866* (2013.01)

(58) Field of Classification Search
CPC ............. H01L 23/3672; H01L 23/3677; H01L 23/3731; H01L 23/4982
See application file for complete search history.

(56) References Cited

U.S. PATENT DOCUMENTS

2013/0269986 A1* 10/2013 Sun ..................... H01L 23/3677
174/252

FOREIGN PATENT DOCUMENTS

TW          I544850         8/2016
TW          I609053         12/2017

* cited by examiner

*Primary Examiner* — Hoai V Pham
(74) *Attorney, Agent, or Firm* — JCIPRNET

(57) ABSTRACT

A package carrier includes a multilayer circuit structure, at least one gas-permeable structure, a first outer circuit layer, a second outer circuit layer, a first solder mask and a second solder mask. The multilayer circuit structure has an upper surface and a lower surface opposite to each other and a plurality of through holes. The gas-permeable structure is in the form of a mesh and disposed in at least one of the through holes. The first and the second outer circuit layers respectively at least cover the upper and the lower surfaces. At least one first opening of the first solder mask exposes a portion of the first outer circuit layer and is disposed corresponding to the gas-permeable structure. At least one second opening of the second solder mask exposes a portion of the second outer circuit layer and is disposed corresponding to the gas-permeable structure.

10 Claims, 6 Drawing Sheets

PACKAGE CARRIER HAVING A MESH GAS-PERMEABLE STRUCTURE DISPOSED IN THE THROUGH HOLE

CROSS-REFERENCE TO RELATED APPLICATION

This application claims the priority benefit of Taiwan application serial no. 107118580, filed on May 30, 2018. The entirety of the above-mentioned patent application is hereby incorporated by reference herein and made a part of this specification.

BACKGROUND OF THE INVENTION

Technical Field

The invention relates to a carrier structure, and particularly relates to a package carrier.

Background

Generally, a package carrier mainly consists of a plurality of circuit layers, wherein a heat-generating element, such as a chip, is mostly disposed on an upper surface of the package carrier. Since the heat-generating element generates heat easily in operation, the operation performance of the heat-generating element is easily affected. For heat-dissipating path of conventional package carrier, the heat is dissipated mainly in a thickness direction (perpendicular to plane). However, the heat-dissipating method is still insufficient because it cannot quickly transmit the heat energy generated by the heat-generating element, which causes that the temperature of the package carrier continues to increase and thus affecting the reliability of the heat-generating element.

SUMMARY

The invention provides a package carrier having a better heat-dissipating effect.

The package carrier of the invention includes a multilayer circuit structure, at least one gas-permeable structure, a first outer circuit layer, a second outer circuit layer, a first solder mask and a second solder mask. The multilayer circuit structure has an upper surface and a lower surface opposite to each other and a plurality of through holes. The through holes connect the upper and the lower surfaces. The gas-permeable structure is in the form of a mesh and disposed in at least one through hole. The first outer circuit layer is disposed on the upper surface of the multilayer circuit structure and at least covers the upper surface. The second outer circuit layer is disposed on the lower surface of the multilayer circuit structure and at least covers the lower surface. The first solder mask is disposed on the first outer circuit layer and has at least one first opening. The first opening exposes a portion of the first outer circuit layer and is disposed corresponding to the gas-permeable structure. The second solder mask is disposed on the second outer circuit layer and has at least one second opening. The second opening exposes a portion of the second outer circuit layer and is disposed corresponding to the gas-permeable structure.

According to an embodiment of the invention, the multilayer circuit structure includes a core layer, a first dielectric layer, a second dielectric layer, a first inner circuit layer and a second inner circuit layer. The core layer has a first surface and a second surface opposite to each other. The first dielectric layer is disposed on the first surface of the core layer. The second dielectric layer is disposed on the second surface of the core layer. The first inner circuit layer is disposed on the first dielectric layer. The second inner circuit layer is disposed on the second dielectric layer.

According to an embodiment of the invention, the core layer includes a core dielectric layer, a first patterned copper foil layer and a second patterned copper foil layer. The core dielectric layer has a first side surface and a second side surface opposite to each other. The first patterned copper foil layer is disposed on the first side surface of the core dielectric layer, and exposes a portion of the first side surface. The second patterned copper foil layer is disposed on the second side surface of the core dielectric layer, and exposes a portion of the second side surface.

According to an embodiment of the invention, the package carrier further includes a seed layer covering the upper surface and lower surface of the multilayer circuit structure and an inner wall of the through holes.

According to an embodiment of the invention, the material of the gas-permeable structure includes metal or ceramics.

According to an embodiment of the invention, the gas-permeable structure has a first side and a second side opposite to each other. The first outer circuit layer and the second outer circuit layer further completely cover the first side and the second side of the gas-permeable structure.

According to an embodiment of the invention, the gas-permeable structure has a first side and a second side opposite to each other. The first outer circuit layer and the second outer circuit layer further partially cover the first side and the second side of the gas-permeable structure.

According to an embodiment of the invention, the package carrier further includes a metal block disposed in one of the through holes, and has a top surface and a bottom surface opposite to each other. The first outer circuit layer and the second outer circuit layer further completely cover the top surface and the bottom surface of the metal block.

According to an embodiment of the invention, the package carrier further includes a first surface treatment layer and a second surface treatment player. The first surface treatment layer is disposed on the first outer circuit layer exposed by the first solder mask. The second surface treatment layer is disposed on the second outer circuit layer exposed by the second solder mask.

According to an embodiment of the invention, the first solder mask and the second solder mask respectively cover an exposed portion of the multilayer circuit structure.

Based on the above, in the design of the package carrier of the invention, the gas-permeable structure is in the form of a mesh and disposed in the through holes of the multilayer circuit structure, and the opening of the solder mask is disposed corresponding to the gas-permeable structure. In this manner, the gas-permeable structure not only can dissipate heat in a thickness direction (i.e., Z direction) of the package carrier, but also can dissipate heat in a plane direction (i.e., X-Y direction) of the package carrier with the design of mesh. Briefly, the package carrier of the invention increases the heat-dissipating area through the configuration of the gas-permeable structure, thereby improving the heat-dissipating effect.

To make the above features and advantages of the invention more comprehensible, embodiments accompanied with drawings are described in detail as follows.

DETAILED DESCRIPTION OF DISCLOSED EMBODIMENTS

Figure 1A:
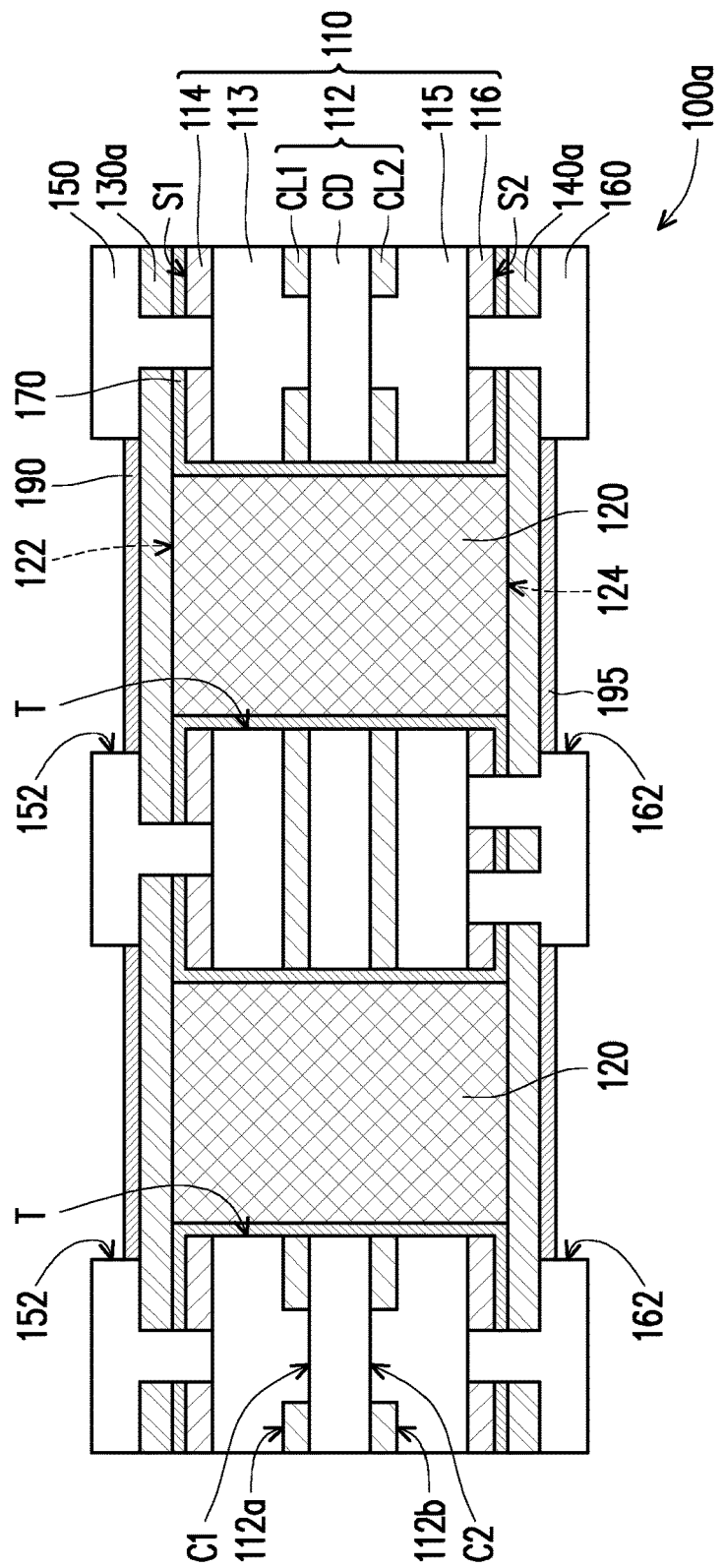
FIG. 1A illustrates a schematic cross-sectional view of a package carrier according to an embodiment of the invention.

FIG. 1A illustrates a schematic cross-sectional view of a package carrier according to an embodiment of the invention. Referring to FIG. 1A, in the embodiment, a package carrier 100a includes a plurality of multilayer circuit structure 110, at least one gas-permeable structure 120 (only two gas-permeable structures are shown in FIG. 1A), a first outer circuit layer 130a, a second outer circuit layer 140a, a first solder mask 150 and a second solder mask 160. The multilayer circuit structure 110 has an upper surface S1 and a lower surface S2 opposite to each other and a plurality of through holes T (only two through holes are shown in FIG. 1A). The through holes T connect the upper surface S1 and the lower surface S2. The gas-permeable structure 120 is in the form of a mesh and respectively disposed in the through holes T. The first outer circuit layer 130a is disposed on the upper surface S1 of the multilayer circuit structure 110 and at least covers the upper surface S1. The second outer circuit layer 140a is disposed on the lower surface S2 of the multilayer circuit structure 110 and at least covers the lower surface S2. The first solder mask 150 is disposed on the first outer circuit layer 130a and has at least one first opening 152 (only two openings are shown in FIG. 1A). The first opening 152 exposes a portion of the first outer circuit layer 130a and is disposed corresponding to the gas-permeable structure 120. The second solder mask 160 is disposed on the second outer circuit layer 140a and has at least one second opening 162 (only two openings are shown in FIG. 1A). The second opening 162 exposes a portion of the second outer circuit layer 140a and is disposed corresponding to the gas-permeable structure 120.

Specifically, the multilayer circuit structure 110 of the embodiment includes a core layer 112, a first dielectric layer 113, a second dielectric layer 115, a first inner circuit layer 114 and a second inner circuit layer 116. The core layer 112 has a first surface 112a and a second surface 112b opposite to each other, wherein the core layer 112 includes a core dielectric layer CD, a first patterned copper foil layer CL1 and a second patterned copper coil layer CL2. The core dielectric layer CD has a first side surface C1 and a second side surface C2 opposite to each other. The first patterned copper foil layer CL1 is disposed on the first side surface C1 of the core dielectric layer CD, and exposes a portion of the first side surface C1. The second patterned copper foil layer CL2 is disposed on the second side surface C2 of the core dielectric layer CD, and exposes a portion of the second side surface C2. The first dielectric layer 113 is disposed on the first surface 112a of the core layer 112, and the second dielectric layer 115 is disposed on the second surface 112b of the core layer 112. The first inner circuit layer 114 is disposed on the first dielectric layer 113, and the second inner circuit layer 116 is disposed on the second dielectric layer 115.

Furthermore, in order to electrically connect the first patterned copper foil layer CL1, the second patterned copper foil layer CL2, the first inner circuit layer 114 and the second inner circuit layer 116, the package carrier 100a of the embodiment further includes a seed layer 170, wherein the seed layer 170 covers the upper surface S1 and the lower surface S2 of the multilayer circuit structure 110 and the inner wall of the through holes T. Herein, as shown in FIG. 1A, the seed layer 170 is disposed between the first outer circuit layer 130a and the first inner circuit layer 114, the second outer circuit layer 140a and the second inner circuit layer 116, and the multilayer circuit structure 110 and the gas-permeable structure 120. The gas-permeable structure 120 is disposed in the through holes T and has a first side 122 and a second side 124 opposite to each other. Herein, the material of the gas-permeable structure 120 is, for example, metal or ceramics, wherein the metal is, for example, gold, silver, copper, aluminum or other metals having higher thermal conductivity. As shown in FIG. 1A, the first outer circuit layer 130a and the second outer circuit layer 140a of the embodiment are not patterned and completely cover the first side 122 and the second side 124 of the gas-permeable structure 120.

Additionally, the first solder mask 150 and the second solder mask 160 of the embodiment are respectively disposed on the first outer circuit layer 130a and the second outer circuit layer 140a, and respectively penetrate through the first outer circuit layer 130a and the second outer circuit layer 140a to be connected to the first dielectric layer 113 and the second dielectric layer 115 of the multilayer circuit structure 110. In other words, the first solder mask 150 and the second solder mask 160 respectively cover the exposed portion of the multilayer circuit structure 110. The first opening 152 of the first solder mask 150 and the second opening 162 of the second solder mask 160 respectively expose a portion of the first outer circuit layer 130a and a portion of the second outer circuit layer 140a. In order to prevent the first outer circuit layer 130a and the second outer circuit layer 140a respectively exposed by the first opening 152 and the second opening 162 from being oxidized, the package carrier 100a of the embodiment further includes a first surface treatment layer 190 and a second surface treatment layer 195. The first surface treatment layer 190 is disposed on the first outer circuit layer 130a exposed by the first solder mask 150. The second surface treatment layer 195 is disposed on the second outer circuit layer 140a exposed by the second solder mask 160.

Since the gas-permeable structure 120 of the embodiment is in the form of a mesh and disposed in the through holes T of the multilayer circuit structure 110, and the first opening 152 of the first solder mask 150 and the second opening 162 of the second solder mask 160 are disposed corresponding to the first side 122 and the second side 124 of the gas-permeable structure 120, in this manner, the gas-permeable structure 120 not only can dissipate heat in the thickness direction (i.e., Z direction) of the package carrier 100a, but also can dissipate heat in the plane direction (i.e., X-Y direction) of the package carrier 100a through the design of mesh. In brief, the package carrier 100a of the embodiment increases the heat-dissipating area through the configuration of the gas-permeable structure 120, thereby increasing the heat-dissipating effect.

Figure 1B:
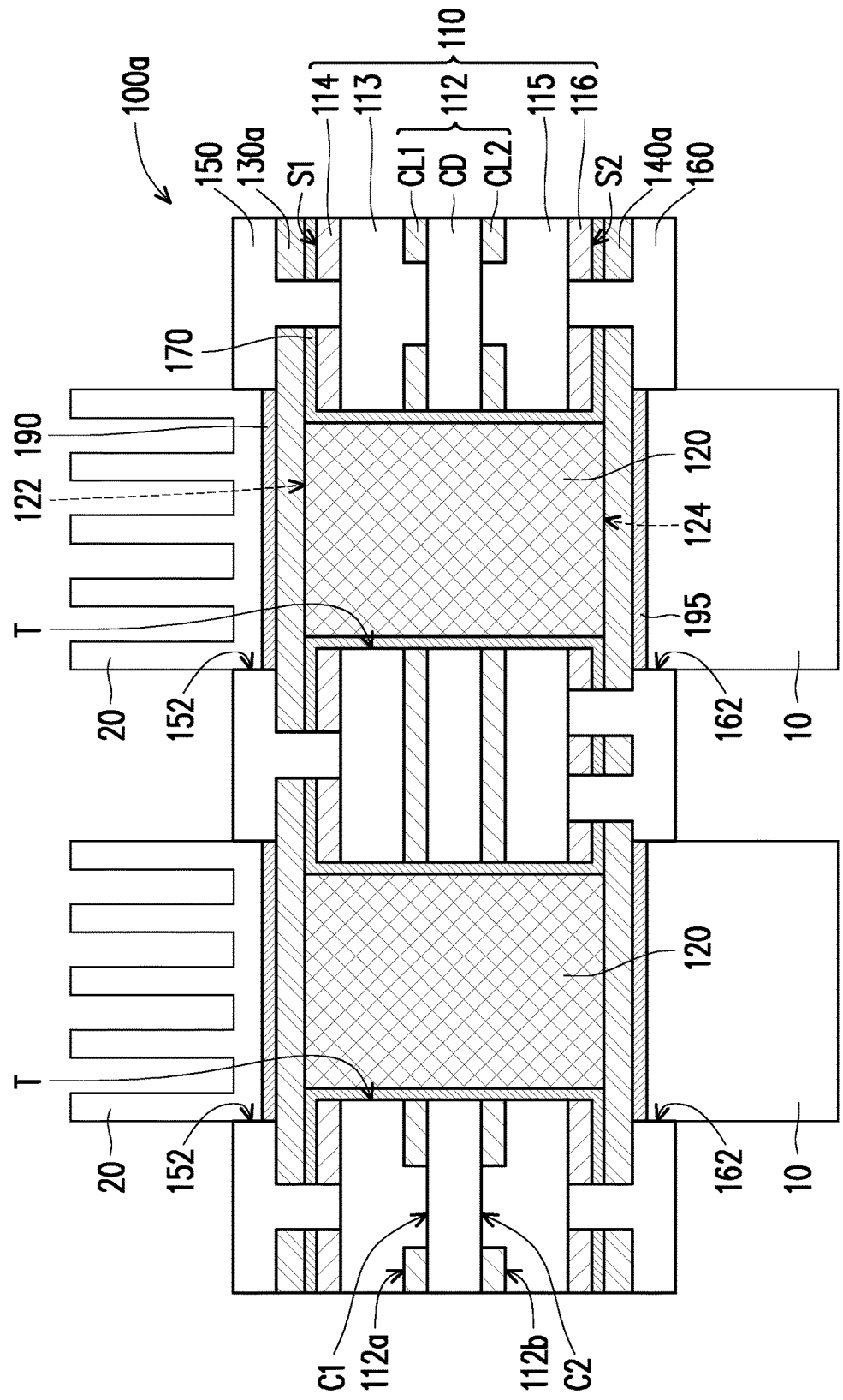
FIG. 1B illustrates a schematic cross-sectional view of the package carrier of FIG. 1A carrying a heat-generating element and a heat-dissipating element.

In application of the package carrier 100a, referring to FIG. 1B, a heat-dissipating fin 20 may be disposed on the first surface treatment layer 190, and the heat-generating element 10 may be disposed on the second surface treatment layer 195. The heat generated by the heat-generating element 10 may be transmitted to the heat-dissipating fin 20 through the second surface treatment layer 195, the second outer circuit layer 140a, the gas-permeable structure 120, the first outer circuit layer 130a and the first surface treatment layer 190 in sequence. Herein, the mesh-shaped gas-permeable structure 120 not only can dissipate heat in the thickness direction (i.e., Z direction) of the package carrier 100a but also can dissipate heat in the plane direction (i.e., X-Y direction) of the package carrier 100a. Accordingly, the package carrier 100a of the embodiment can increase the heat-dissipating area through the configuration of the gas-permeable structure 120, thereby improving the heat-dissipating effect.

It is to be explained that, the following embodiment has adopted component notations and part of the contents from the previous embodiment, wherein the same notations are used for representing the same or similar components, and descriptions of the same technical contents are omitted. The descriptions regarding the omitted part may be referred to the previous embodiments, and thus are not repeated herein.

Figure 2A:
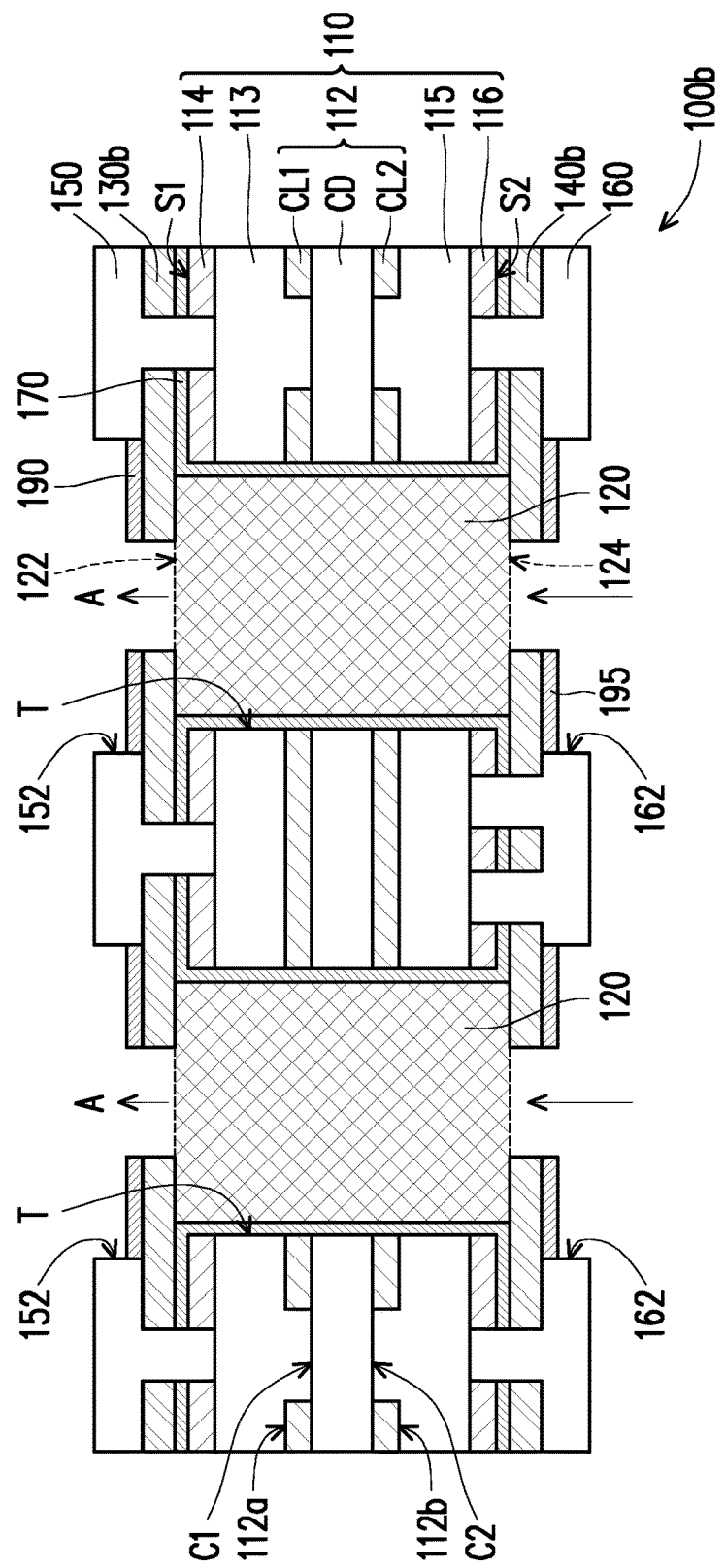
FIG. 2A illustrates a schematic cross-sectional view of a package carrier according to another embodiment of the invention.
Figure 2B:
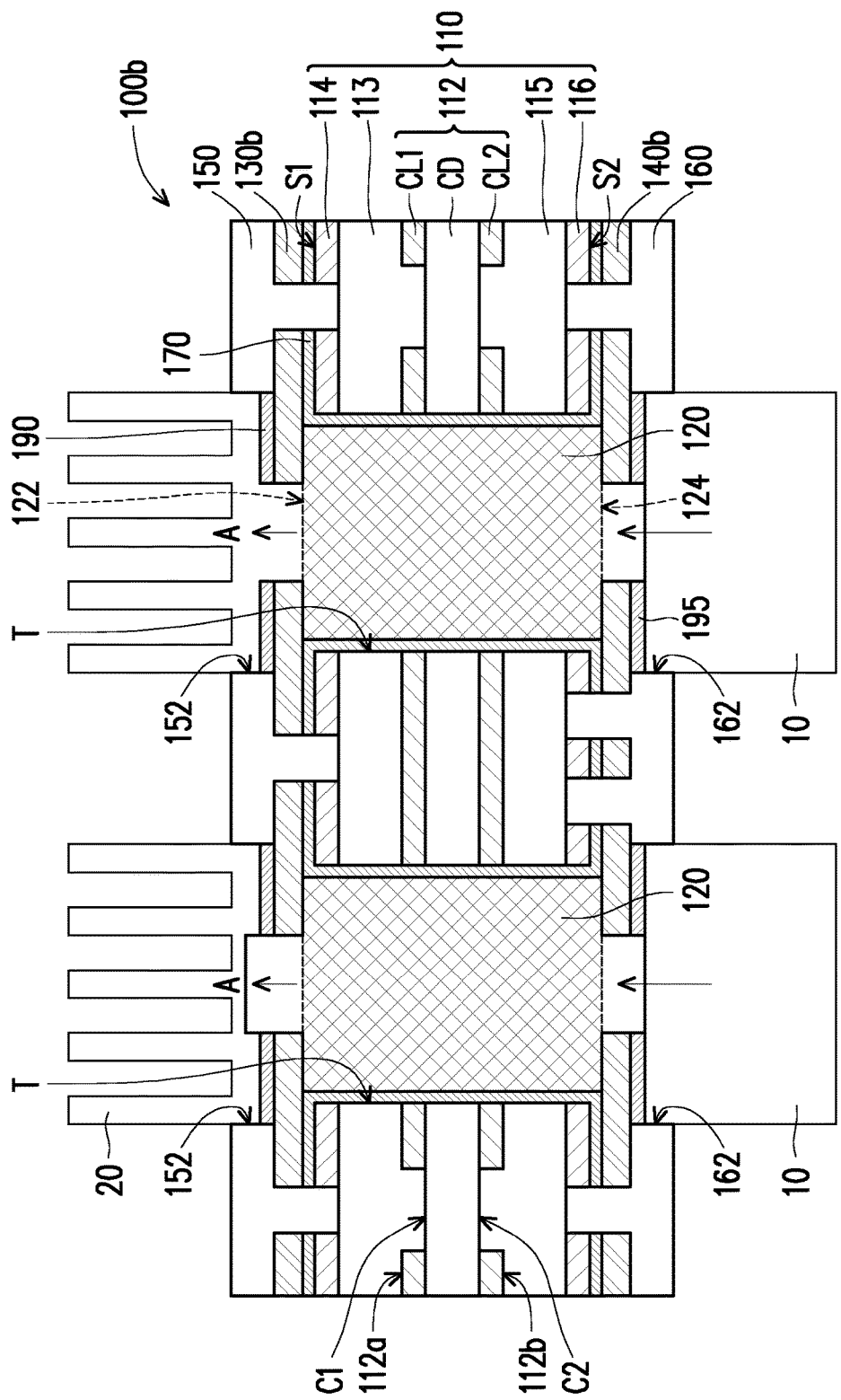
FIG. 2B illustrates a schematic cross-sectional view of the package carrier in FIG. 2A carrying a heat-generating element and a heat-dissipating element.

FIG. 2A illustrates a schematic cross-sectional view of a package carrier according to another embodiment of the invention. FIG. 2B illustrates a schematic cross-sectional view of the package carrier in FIG. 2A carrying a heat-generating element and a heat-dissipating element. Referring to FIG. 1A and FIG. 2A, a package carrier 100b of the embodiment is similar to the package carrier 100a in FIG. 1A, and the difference between the two is that a first outer circuit layer 130b and a second outer circuit layer 140b of the embodiment partially cover the first side 122 and the second side 124 of the gas-permeable structure 120. In other words, the first outer circuit layer 130b and the second outer circuit layer 140b of the embodiment are patterned structures respectively, and the first outer circuit layer 130b and the second outer circuit layer 140b respectively expose a portion of the first side 122 and a portion of the second side 124 of the gas-permeable structure 120.

In application of the package carrier 100b, referring to FIG. 2B, the heat-dissipating fin 20 may be disposed on the first surface treatment layer 190, and the heat-generating element 10 may be disposed on the second surface treatment layer 195. The heat generated by the heat-generating element 10 may be dissipated in the thickness direction (i.e., Z direction) of the package carrier 100b by the gas-permeable structure 120, and the heat energy in the package carrier 100b may be dissipated in the plane direction (i.e., X-Y direction) of the package carrier 100b through the mesh-shaped gas-permeable structure 120, and outer air A can directly pass through the gas-permeable structure 120 to dissipate the heat in the package carrier 100b. In brief, the embodiment increases the heat-dissipating area through the configuration of the gas-permeable structure 120, thereby improving the heat-dissipating effect of the package carrier 100b.

Figure 3A:
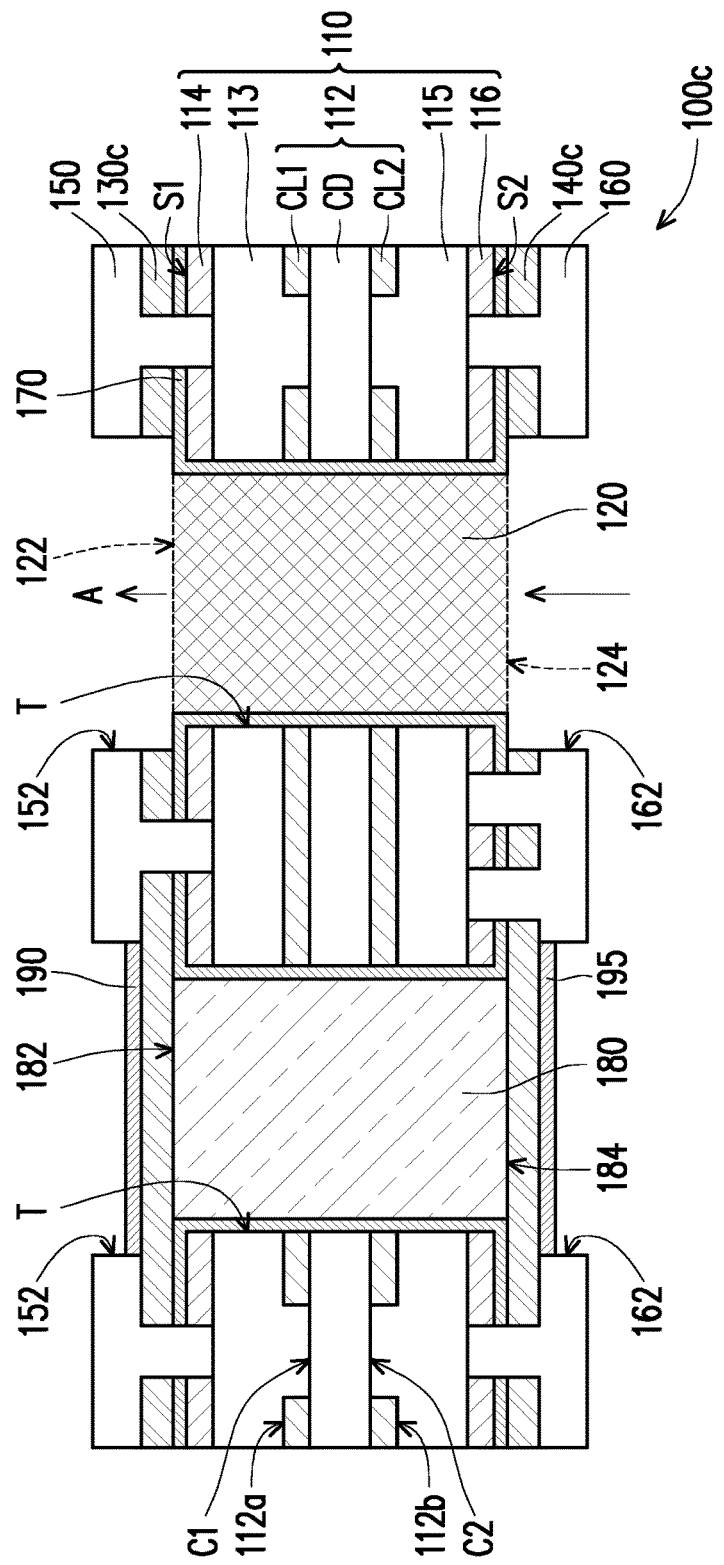
FIG. 3A illustrates a schematic cross-sectional view of a package carrier according to yet another embodiment of the invention.
Figure 3B:
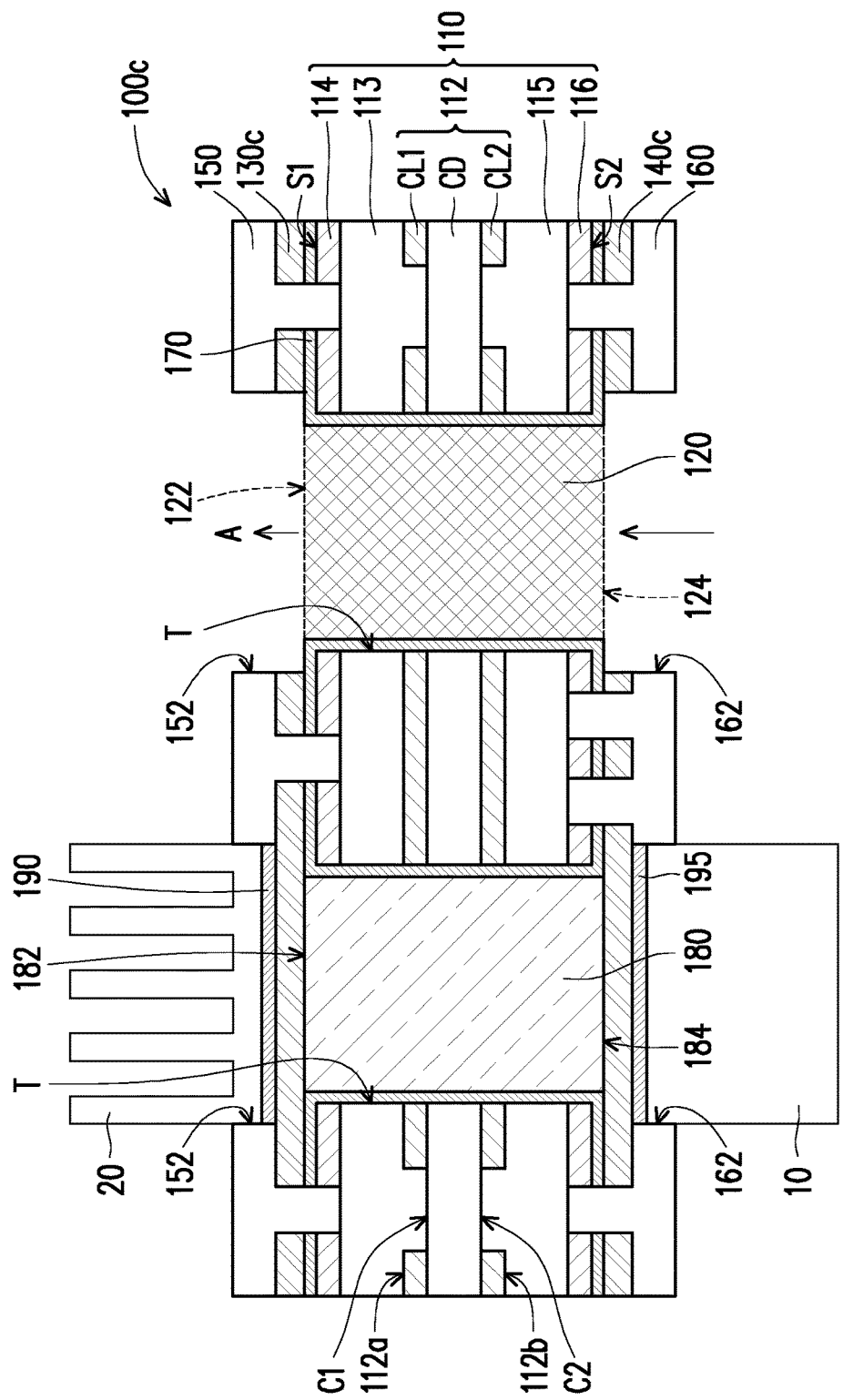
FIG. 3B illustrates a schematic cross-sectional view of the package carrier in FIG. 3A carrying a heat-generating element and a heat-dissipating element.

FIG. 3A illustrates a schematic cross-sectional view of a package carrier according to yet another embodiment of the invention. FIG. 3B illustrates a schematic cross-sectional view of the package carrier in FIG. 3A carrying a heat-generating element and a heat-dissipating element. Referring to FIG. 1A and FIG. 3A, a package carrier 100c in the embodiment is similar to the package carrier 100a in FIG. 1A, and the difference between the two is that the package carrier 100c in the embodiment further includes a metal block 180, wherein the metal block 180 is disposed in one of the through holes T, and the metal block 180 has a top surface 182 and a bottom surface 184 opposite to each other. Herein, the first outer circuit layer 130c and the second outer circuit layer 140c further completely cover the top surface 182 and the bottom surface 184 of the metal block 180. In other words, the first outer circuit layer 130c and the second outer circuit layer 140c respectively expose the first side 122 and the second side 124 of the gas-permeable structure 120.

In application of the package carrier 100c, referring to FIG. 3B, the heat-dissipating fin 20 may be disposed on the first surface treatment layer 190, and the heat-generating element 10 may be disposed on the second surface treatment layer 195. The heat generated by the heat-generating element 10 may be transmitted to the heat-dissipating fin 20 through the second surface treatment layer 195, the second outer circuit layer 140c, the metal block 180, the first outer circuit layer 130c and the first surface treatment layer 190 in sequence. That is, the heat may be dissipated in the thickness direction (i.e., Z direction) of the package carrier 100c through the metal block 180. The heat energy in the package carrier 100c may be dissipated in the plane direction (i.e., X-Y direction) of the package carrier 100c through the mesh-shaped gas-permeable structure 120, and outer air A can directly pass through the gas-permeable structure 120 to dissipate the heat in the package carrier 100c. In brief, the package carrier 100c in the embodiment may have a better heat-dissipating effect.

Certainly, in other embodiments that are not shown, a fan can be selectively disposed on the second side of the gas-permeable structure, thereby increasing air circulation and further improving the heat-dissipating effect of the package carrier.

In summary, in the design of the package carrier of the invention, the gas-permeable structure is in the form of a mesh and disposed in the through holes of the multilayer circuit structure, and the opening of the solder mask is disposed corresponding to the gas-permeable structure. In this manner, the gas-permeable structure not only can dissipate heat in a thickness direction (i.e., Z direction) of the package carrier, but also can dissipate heat in a plane direction (i.e., X-Y direction) of the package carrier with the design of mesh. Briefly, the package carrier of the invention increases the heat-dissipating area through the configuration of the gas-permeable structure, thereby improving the heat-dissipating effect.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:
1. A package carrier, comprising:
   a multilayer circuit structure, having an upper surface and a lower surface opposite to each other and a plurality of through holes, the plurality of through holes connecting the upper surface and the lower surface;
   at least one gas-permeable structure, in the form of a mesh and disposed in at least one of the plurality of through holes;
   a first outer circuit layer, disposed on the upper surface of the multilayer circuit structure, and at least covering the upper surface;

a second outer circuit layer, disposed on the lower surface of the multilayer circuit structure, and at least covering the lower surface;

a first solder mask, disposed on the first outer circuit layer, and having at least one first opening, wherein the at least one first opening exposes a portion of the first outer circuit layer and is disposed corresponding to the at least one gas-permeable structure; and a second solder mask, disposed on the second outer circuit layer, and having at least one second opening, wherein the at least one second opening exposes a portion of the second outer circuit layer and is disposed corresponding to the at least one gas-permeable structure.

2. The package carrier as recited in claim 1, wherein the multilayer circuit structure comprises:

a core layer, having a first surface and a second surface opposite to each other;

a first dielectric layer, disposed on the first surface of the core layer;

a second dielectric layer, disposed on the second surface of the core layer;

a first inner circuit layer, disposed on the first dielectric layer; and a second inner circuit layer, disposed on the second dielectric layer.

3. The package carrier as recited in claim 2, wherein the core layer comprises:

a core dielectric layer, having a first side surface and a second side surface opposite to each other;

a first patterned copper foil layer, disposed on the first side surface of the core dielectric layer, and exposing a portion of the first side surface; and a second patterned copper foil layer, disposed on the second side surface of the core dielectric layer, and exposing a portion of the second side surface.

4. The package carrier as recited in claim 1, further comprising:

a seed layer, covering the upper surface and the lower surface of the multilayer circuit structure and an inner wall of the plurality of through holes.

5. The package carrier as recited in claim 1, wherein a material of the gas-permeable structure comprises metal or ceramics.

6. The package carrier as recited in claim 1, wherein the at least one gas-permeable structure has a first side and a second side opposite to each other, and the first outer circuit layer and the second outer circuit layer further completely cover the first side and the second side of the at least one gas-permeable structure.

7. The package carrier as recited in claim 1, wherein the at least one gas-permeable structure has a first side and a second side opposite to each other, and the first outer circuit layer and the second outer circuit layer further partially cover the first side and the second side of the at least one gas-permeable structure.

8. The package carrier as recited in claim 1, further comprising:

a metal block, disposed in one of the plurality of through holes, and having a top surface and a bottom surface opposite to each other, wherein the first outer circuit layer and the second outer circuit layer further completely cover the top surface and the bottom surface of the metal block.

9. The package carrier as recited in claim 1, further comprising:

a first surface treatment layer, disposed on the first outer circuit layer exposed by the first solder mask; and a second surface treatment layer, disposed on the second outer circuit layer exposed by the second solder mask.

10. The package carrier as recited in claim 1, wherein the first solder mask and the second solder mask respectively cover an exposed portion of the multilayer circuit structure.

* * * * *